(12) United States Patent
Creasy et al.

(10) Patent No.: US 10,122,525 B2
(45) Date of Patent: Nov. 6, 2018

(54) METHOD AND APPARATUS FOR PERFORMING A HOLDOVER FUNCTION ON A HOLDOVER LINE CARD

(71) Applicants: Simon P. Creasy, Ottawa (CA); Steven G. Driediger, Ottawa (CA)

(72) Inventors: Simon P. Creasy, Ottawa (CA); Steven G. Driediger, Ottawa (CA)

(73) Assignee: NOKIA OF AMERICA CORPORATION, Murray Hill, NJ (US)

( * ) Notice: Subject to any disclaimer, the term of this patent is extended or adjusted under 35 U.S.C. 154(b) by 0 days.

(21) Appl. No.: 15/456,211

(22) Filed: Mar. 10, 2017

(65) Prior Publication Data

US 2018/0262324 A1   Sep. 13, 2018

(51) Int. Cl.
*H04L 7/033* (2006.01)
*H04L 5/00* (2006.01)

(52) U.S. Cl.
CPC ............ *H04L 7/033* (2013.01); *H04L 5/0048* (2013.01)

(58) Field of Classification Search
CPC .............................. H04L 7/033; H04L 5/0048
USPC ......................................................... 375/376
See application file for complete search history.

(56) References Cited

U.S. PATENT DOCUMENTS

| | | | |
|---|---|---|---|
| 2002/0190764 A1* | 12/2002 | Nichols ................ | H03L 7/0994 327/156 |
| 2008/0069285 A1* | 3/2008 | Kon ........................ | H03L 7/143 375/376 |
| 2011/0305248 A1* | 12/2011 | Lin ...................... | H04L 12/4625 370/503 |

* cited by examiner

*Primary Examiner* — Michael Neff
(74) *Attorney, Agent, or Firm* — Kramer Amado, PC

(57) ABSTRACT

Various embodiments relate to a network node and method thereof including a high stability oscillator and a holdover phase-locked loop ("PLL") wherein the holdover PLL is configured to perform a holdover function by receiving a system clock signal, disciplining the high stability oscillator using the system clock signal to generate a local reference signal, and providing the local reference signal as the system clock signal when the system clock signal becomes unavailable.

20 Claims, 2 Drawing Sheets

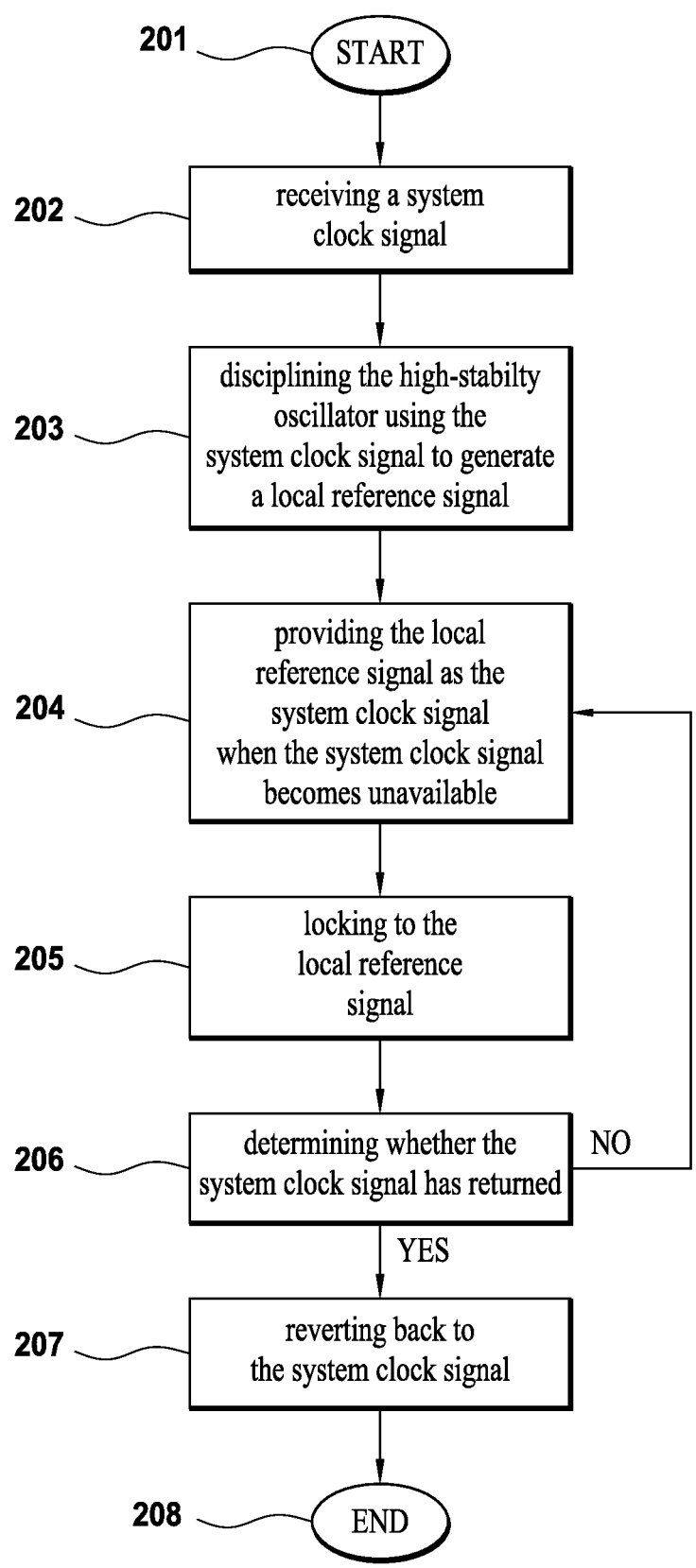

METHOD AND APPARATUS FOR PERFORMING A HOLDOVER FUNCTION ON A HOLDOVER LINE CARD

TECHNICAL FIELD

This disclosure relates generally to telecommunication network nodes, and more specifically, but not exclusively, to performing network synchronization functions such as a holdover function.

BACKGROUND

In a network, data passes through network nodes. The network nodes allow data to be routed to their destinations. Such network nodes often include a plurality of line cards and one or more control cards. The line cards are coupled to a plurality of lines, while the control cards control the line cards.

Network node clocks typically have a central oscillator that can serve several functions, including, but not limited to being a local oscillator for the node's Synchronous Equipment Timing Source ("SETS") Phase-Locked Loop ("PLL") during locked operation, providing the SETS PLL with frequency holdover in the event of all references being lost and/or proving the node with time holdover in the event of all references being lost.

Historically, a network node which has holdover requirements in the network is constrained by the need to keep its frequency within certain limits when in holdover mode. With newer applications, such as mobile networks, requiring time delivery from the network, there are new and much more stringent holdover requirements evolving that require a node to keep time within set limits. For example, a node which loses all of its frequency references may need to keep time to within a few microseconds for a day or more.

The choice of oscillator for these types of applications is a tradeoff between cost and performance and in particular, frequency stability performance. The oscillator is typically soldered down on a central function card such that it may not be replaceable. The choice of oscillator and thus the tradeoff is determined at the time the central function card is designed and then provisioned.

This can be a problem if different applications require different cost/performance tradeoffs for their oscillator. Because the oscillator is soldered down and its output is directly connected to the SETS PLL input on the central function card, the oscillator alone cannot be field upgraded.

If application requirements of the network node change, the central function card needs to have a design upgrade and then be swapped out in the field, which can incur significant development costs for the equipment provider and disruption to the network operator using the node.

Furthermore, it is possible that a design upgrade to the central function card circuitry in order to improve oscillator performance, is not possible due to the physical size increase of a higher-stability oscillator.

Currently, in order to meet evolving holdover requirements of a network node clock's central oscillator, a user must perform a design upgrade of the central function card, or entire node if that central resource is not field-upgradeable with an appropriate oscillator, and then swap out the circuit card assemblies ("CCAs") or the entire node in the field.

SUMMARY OF EXEMPLARY EMBODIMENTS

A brief summary of various embodiments is presented below. Embodiments address the need to create a higher stability oscillator in a central function card of a network node when performance requirements change by configuring a holdover function to be performed on a holdover line card which includes a high stability oscillator.

In order to overcome these and other shortcomings of the prior art and in light of the present need to create a higher stability oscillator in a central function card of a network node when performance requirements change by configuring a holdover function to be performed on a holdover line card which includes a high stability oscillator, a brief summary of various exemplary embodiments is presented. Some simplifications and omissions may be made in the following summary, which is intended to highlight and introduce some aspects of the various exemplary embodiments, but not to limit the scope of the invention.

Detailed descriptions of a preferred exemplary embodiment adequate to allow those of ordinary skill in the art to make and use the inventive concepts will follow in later sections.

Various embodiments described herein relate to a network node including a high stability oscillator and a holdover phase-locked loop ("PLL") wherein the holdover PLL is configured to perform a holdover function by receiving a system clock signal, disciplining the high stability oscillator using the system clock signal to generate a local reference signal and providing the local reference signal as the system clock signal when the system clock signal becomes unavailable.

In an embodiment of the present disclosure, the holdover PLL configured to perform the holdover function by further reverting back to the system clock when the system clock becomes available.

In an embodiment of the present disclosure, the system clock signal is received from a synchronous equipment timing source ("SETS") PLL on a central function card.

In an embodiment of the present disclosure, the local reference signal is provided from the holdover PLL to the central function card.

In an embodiment of the present disclosure, the holdover PLL is configured to perform the holdover function by determining whether system clock signal has become unavailable.

In an embodiment of the present disclosure, the holdover PLL is configured to perform the holdover function by locking the SETS PLL on the central function card to the local reference signal.

In an embodiment of the present disclosure, the system clock signal is transmitted from a fanout on the central function card to the holdover PLL on the holdover line card.

In an embodiment of the present disclosure, the local reference signal is transmitted from the holdover PLL on the holdover line card to a selector on the central function card.

In an embodiment of the present disclosure, the high stability oscillator is a temperature-compensated crystal oscillator, an oven controlled crystal oscillator, a double oven controlled crystal oscillator, an atomic clock or any oscillator which has a higher stability than an oscillator on the central function card.

In an embodiment of the present disclosure, the high-stability oscillator is positioned external to the holdover line card and connected to the holdover line card to achieve the same effect as if positioned on the holdover line card.

Various embodiments described herein relate to a method for performing a holdover function on a network node, including the steps of receiving a system clock signal, disciplining a high stability oscillator using the system clock signal to generate a local reference signal and providing the local reference signal as the system clock when the system clock signal becomes unavailable.

In an embodiment of the present disclosure, the method including reverting back to the system clock when the system clock becomes available.

In an embodiment of the present disclosure, the system clock signal is received from a synchronous equipment timing source ("SETS") PLL on a central function card.

In an embodiment of the present disclosure, the local reference signal is provided from the holdover PLL to the central function card.

In an embodiment of the present disclosure, the method including determining whether system clock signal has become unavailable.

In an embodiment of the present disclosure, the method including locking the SETS PLL on the central function card to the local reference signal.

In an embodiment of the present disclosure, the system clock signal is transmitted from a fanout on the central function card to the holdover PLL on the holdover line card.

In an embodiment of the present disclosure, the local reference signal is transmitted from the holdover PLL on the holdover line card to a selector on the central function card.

In an embodiment of the present disclosure, the high stability oscillator is a temperature-compensated crystal oscillator, an oven controlled crystal oscillator, a double oven controlled crystal oscillator, an atomic clock or any oscillator which has a higher stability than an oscillator on the central function card.

In an embodiment of the present disclosure, the high-stability oscillator is positioned external to the holdover line card and connected to the holdover line card to achieve the same effect as if positioned on the holdover line card.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

These and other more detailed and specific features are more fully disclosed in the following specification, reference being had to the accompanying drawings, in which:

FIG. 2 is a flow diagram illustrating an embodiment of a process for selecting a synchronization source from a holdover line card.

DETAILED DESCRIPTION OF THE INVENTION

Figure 1:
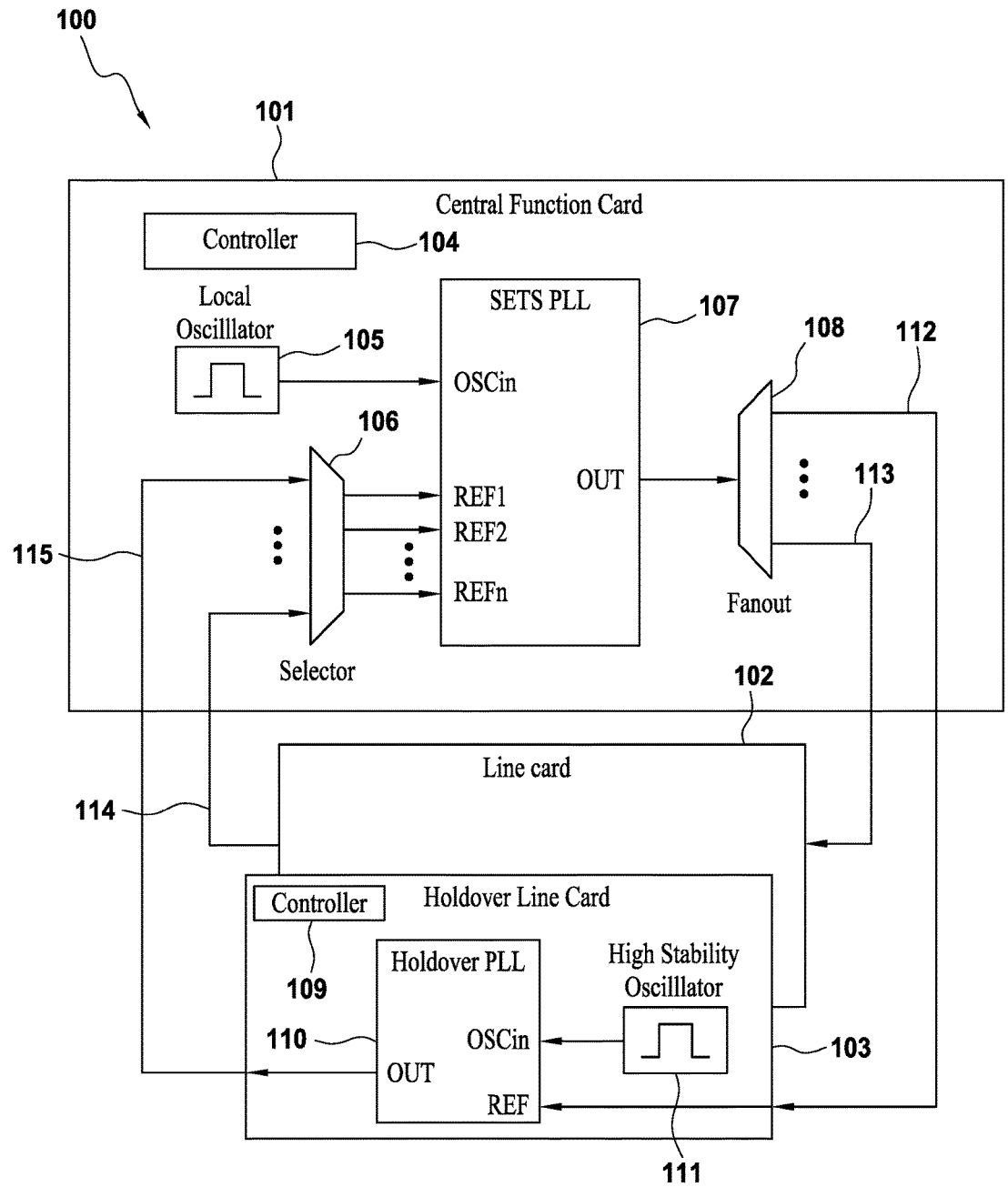
FIG. 1 is a block diagram illustrating an embodiment of a network node comprising a central function card, a line card and a holdover line card.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable.

A method and apparatus is needed to implement a higher stability oscillator in a central function card of a network node when performance requirements change by configuring a holdover function to be performed on a holdover line card which includes a high stability oscillator.

This disclosure provides a means of using line cards, which are field replaceable, in a network node, which traditionally do not function in a holdover operation, to allow the holdover functions of the node to be made field-upgradeable.

Existing network nodes in the field whose holdover performance is limited by the oscillator deployed on the central resource card can have holdover performance improved with the deployment of a holdover line card.

Furthermore, new network nodes could be designed with a lower-cost and/or performance oscillator on the central function card to suit the lowest-performance applications and by using the holdover line card the oscillator in the new network nodes may be upgraded to a better oscillator, when necessary. This may be accomplished by replacing the hold over line card with a holdover line card with a better oscillator or by using a hold over line card with a field-replacable oscillator.

However, applications for which the local oscillator of the central function card provides adequate holdover performance may not need to use the holdover line card and therefore allows one more line card slot available to increase the system capacity.

For both network nodes already deployed and new network nodes yet to be deployed, use of holdover line cards allows the cost and performance tradeoffs of the holdover oscillator to be tailored to a particular application by inserting a holdover line card to suit the particular needs of the network node.

By adding a holdover line card, which includes a high stability oscillator, the function of the higher-performance oscillator on a holdover line card may perform the holdover function. The "higher-performance" oscillator is higher stability than the one provided to the SETS on the control card.

FIG. 1 illustrates a block diagram of a network node 100 which includes a central function card 101 and a plurality of line cards 102.

During normal operation (i.e. not during a holdover operation), an extracted clock signal from the line card 102 is used to provide a reference input to the SETS PLL 107 on the central function card 101. The line card 102 (or another line card) may provide a reference clock signal derived from a GPS, atomic clock, or some other highly accurate source used to clock the system from within the network.

The central function card 101 is included in a network node 100. The network node 100 also has one or more field-replaceable line cards 102. Each line card 102 is provided with a copy of the SETS PLL 107 output clock that constitutes the system frequency and timebase.

The selector 106 may receive multiple clock references, for example there may be some redundancy and the selector 106 may be used to fall back to another reference source. Once all of those reference sources are lost then the holdover line card 103 will be used.

The central function card 101 includes a controller 104, a local oscillator 105, synchronous equipment timing source ("SETS") phase-locked loop ("PLL") 107, a selector 106 and a fanout 108.

The SETS PLL 107 may receive a reference signal from the line card 102 through the selector 106. The SETS PLL 107 may also receive the oscillator input signal from the local oscillator 105. The SETS PLL 107 may also transmit an output signal to the fanout 108.

A reference signal from the line card 102 may be received through the selector 106 by the connection 114.

Multiple reference signals from multiple holdover line cards 103 or multiple line cards 102 may be received through the selector 106 by the connection 115 and by the connection 114, respectively.

The SETS PLL 107 may transmit a reference signal to a line card 102 through the fanout 108 by connection 113.

The SETS PLL 107 may transmit a reference signal to a holdover line card 103 through the fanout 108 by connection 112.

The network node 100 may include a plurality of line cards 102. One type of line card 102 is a holdover line card 103.

The holdover line card 103 may include a high stability oscillator 111, a holdover PLL 110 and a controller 109.

In an alternate embodiment, the high stability oscillator 111 may be external to the holdover line card 103. In yet another embodiment, the high stability oscillator 111 may be field replaceable so that the whole card need not be replaced to upgrade the oscillator.

The holdover PLL 110 may receive the high stability oscillator input signal from the high stability oscillator 111. The holdover PLL 110 may receive a reference signal through the fanout 108 by the connection 112. The holdover PLL 110 may receive a reference signal from another source, such as a local GPS receiver.

The holdover PLL 110 may transmit a reference signal to the SETS PLL 107 through the selector 106 by the connection 115.

The SETS PLL 107 on the central function card 101 provides a reference signal to the plurality of line cards 102, which is used during a locked operation to discipline the higher-performance oscillator on the holdover line card 103.

A holdover function can be performed on a holdover line card 103 which may include a high stability oscillator 111. The term "high stability" is relative to the local oscillator 108 on the central function card 101 and could be, for example, a high-performance oven-controlled crystal oscillator ("OCXO"), a double-oven OCXO or a Rubidium atomic clock, depending on the type of holdover performance which is required. Further examples could include a cesium atomic clock or a hydrogen maser atomic clock.

The high stability oscillator 111 is disciplined with the holdover PLL 110 whenever the SETS PLL 107 is locked to a primary reference clock ("PRC"), such as one derived from GPS, an atomic clock, or some other high accuracy reference used as a PRC.

The output of the holdover PLL 110 uses the connection 115 to send the holdover frequency back to the selector 106 connected to the SETS PLL 107. In prior systems, when there is a PRC failure, the SETS PLL 107 would have entered holdover with a local oscillator 105. With the hold over line card, the SETS PLL 107 instead switches to the holdover frequency from the holdover line card 103.

The SETS PLL 107 switches from another line card reference 114, which is traceable to a primary reference clock, to the clock derived from the high stability oscillator 111.

The high stability oscillator 111 does not directly replace the local oscillator 105 of the central function card 101, but indirectly does so by appearing to be an extracted line clock from a line card 102.

The holdover PLL 110 must stop disciplining itself to the clock from the SETS PLL 107 otherwise a timing loop would be formed where the SETS PLL 107 is disciplining itself to the holdover PLL 110, and the holdover PLL 110 is disciplining itself to the SETS PLL.

This coordination would typically be done via the controller on the central function card, or via an indication from the SETS PLL to the holdover PLL indicating that it has selected the holdover PLL's reference to lock to.

Furthermore, the controller 104 and the controller 109 would include instructions for the switching of reference signals at the SETS PLL 107 and the switchover of the holdover PLL 110 into a holdover mode, to avoid a timing loop.

Furthermore, the system may include multiple redundant central function cards which operate together to perform the function of a single central function card 101. In the present embodiment, the line cards 102 (including the holdover line card 103) may receive clock reference signals from each of the multiple redundant central function cards and the holdover line card 103 disciplines its high stability oscillators with one of the clock reference signals from the multiple redundant central function cards through connection 112 and fans out its reference clock signal over connection 114 to the multiple redundant central function cards.

FIG. 2 illustrates a flow diagram for a method 200 of selecting a synchronization source from a holdover line card.

The method 200 begins at step 201. The method 200 then proceeds to step 202 where the network node receives a system clock signal.

The method 200 then proceeds to step 203 where the high-stability oscillator is disciplined using the system clock to generate a local reference signal.

The method 200 then proceeds to step 204 where the local reference signal is provided as the system clock when the system clock becomes unavailable.

The method 200 proceeds to step 205 where the local reference signal is locked to.

The method 200 proceeds to step 206 where a determination is made as to whether the system clock has returned. If yes, the method 200 proceeds to step 207 where the system clock is reverted back to then proceeds to step 208 to end. If no, the method 200 proceeds back to step 204.

It should be apparent from the foregoing description that various exemplary embodiments of the invention may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A non-transitory machine-readable storage medium may include any mechanism for storing information in a form readable by a machine, such as a personal or laptop computer, a server, or other computing device. Thus, a non-transitory machine-readable storage medium may include read-only memory (ROM), random-access memory (RAM), magnetic disk storage media, optical storage media, flash-memory devices, and similar storage media and excludes transitory signals.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A network node, comprising:
a timing circuit comprising a phase lock loop ("PLL") and a first oscillator, wherein the PLL is configured to generate a system clock signal based on source timing information and an output of the first oscillator;
a holdover circuit comprising a second oscillator, the second oscillator having higher stability than the first oscillator, the holdover circuit using the system clock signal from the timing circuit to discipline the second oscillator and generate a local reference clock signal,
wherein the local reference clock signal is used as the source timing information for the timing circuit to generate a disciplined system clock signal in response to which the holdover circuit does not discipline using the disciplined system clock signal.

2. The network node of claim 1, further comprising:
reverting back to the system clock signal based on source timing information.

3. The network node of claim 1, wherein the system clock signal is received from a synchronous equipment timing source ("SETS") PLL on a timing circuit.

4. The network node of claim 3, wherein the local reference clock signal is provided from the holdover circuit to the timing circuit.

5. The network node of claim 1, further comprising the holdover circuit:
determining whether the system clock signal has become unavailable.

6. The network node of claim 3, further comprising the holdover circuit:
locking the SETS PLL on the timing circuit to the local reference clock signal.

7. The network node of claim 3, wherein the system clock signal is transmitted from a fanout on the timing circuit to the holdover circuit.

8. The network node of claim 3, wherein the local reference clock signal is transmitted from the holdover circuit to a selector on the timing circuit.

9. The network node of claim 3, wherein the second oscillator is a temperature-compensated crystal oscillator, an oven controlled crystal oscillator, a double oven controlled crystal oscillator, an atomic clock or any oscillator which has a higher stability than the first oscillator.

10. The network node of claim 3, wherein the second oscillator is positioned external to the holdover circuit and connected to the holdover circuit to achieve the same effect as if positioned on the holdover circuit.

11. A method for performing a holdover function on a network node, comprising the steps of:
generating a system clock signal, by a phase lock loop ("PLL") on a timing circuit including and a first oscillator, based on source timing information and an output of the first oscillator;
disciplining, by a holdover circuit including a second oscillator, the second oscillator having higher stability than the first oscillator, the second oscillator using the system clock signal from the timing circuit and generating a local reference clock signal,
wherein the local reference clock signal is used as the source timing information for the timing circuit to generate a disciplined system clock signal in response to which the holdover circuit does not discipline using disciplined the system clock signal.

12. The method of claim 11, further comprising:
reverting back to the system clock signal based on source timing information.

13. The method of claim 11, wherein the system clock signal is received from a synchronous equipment timing source ("SETS") PLL on a timing circuit.

14. The method of claim 13, wherein the local reference clock signal is provided from the holdover circuit to the timing circuit.

15. The method of claim 11, further comprising:
  determining whether the system clock signal has become unavailable.

16. The method of claim 13, further comprising:
  locking the SETS PLL on the timing circuit to the local reference clock signal.

17. The method of claim 13, wherein the system clock signal is transmitted from a fanout on the timing circuit to the holdover circuit.

18. The method of claim 13, wherein the local reference clock signal is transmitted from the holdover circuit to a selector on the timing circuit.

19. The method of claim 13, wherein the second oscillator is a temperature-compensated crystal oscillator, an oven controlled crystal oscillator, a double oven controlled crystal oscillator, an atomic clock or any oscillator which has a higher stability than the first oscillator.

20. The method of claim 13, wherein the second oscillator is positioned external to the holdover circuit and connected to the holdover circuit to achieve the same effect as if positioned on the holdover circuit.

\* \* \* \* \*